United States Patent
Maher et al.

(10) Patent No.: US 11,340,331 B2
(45) Date of Patent: May 24, 2022

(54) RADAR DATA BUFFERING

(71) Applicant: UHNDER, INC., Austin, TX (US)

(72) Inventors: Monier Maher, St. Louis, MO (US);
Curtis Davis, St. Louis, MO (US);
Frederick Rush, Austin, TX (US);
Aria Eshraghi, Austin, TX (US)

(73) Assignee: Uhnder, Inc., Austin, TX (US)

( * ) Notice: Subject to any disclaimer, the term of this patent is extended or adjusted under 35 U.S.C. 154(b) by 958 days.

(21) Appl. No.: 15/978,457

(22) Filed: May 14, 2018

(65) Prior Publication Data

US 2018/0259620 A1    Sep. 13, 2018

Related U.S. Application Data

(63) Continuation of application No. 15/892,764, filed on Feb. 9, 2018, now Pat. No. 9,971,020.
(Continued)

(51) Int. Cl.
*G01S 7/35* (2006.01)
*G01S 13/64* (2006.01)
(Continued)

(52) U.S. Cl.
CPC .............. *G01S 7/352* (2013.01); *G01S 7/032* (2013.01); *G01S 7/285* (2013.01); *G01S 7/354* (2013.01);
(Continued)

(58) Field of Classification Search
CPC ..... G01S 7/285–288; G01S 7/352–354; G01S 13/931; G01S 7/032; G01S 13/06;
(Continued)

(56) References Cited

U.S. PATENT DOCUMENTS

| | | | |
|---|---|---|---|
| 1,882,128 | A | 10/1932 | Fearing |
| 3,374,478 | A | 3/1968 | Blau |

(Continued)

FOREIGN PATENT DOCUMENTS

| | | |
|---|---|---|
| EP | 0725480 | 11/2011 |
| EP | 2374217 | 4/2013 |

(Continued)

OTHER PUBLICATIONS

Chambers et al., "An article entitled Real-Time Vehicle Mounted Multistatic Ground Penetrating Radar Imaging System for Buried Object Detection," Lawrence Livermore National Laboratory Reports (LLNL-TR-615452), Feb. 4, 2013; Retrieved from the Internet from https://e-reports-ext.llnl.gov/pdf/711892.pdf.

(Continued)

*Primary Examiner* — Matthew M Barker
(74) *Attorney, Agent, or Firm* — Gardner Linn

(57) ABSTRACT

A radar system includes transmitters and receivers configured for installation and use in a vehicle. The transmitters transmit radio signals. The receivers receive radio signals that include the transmitted radio signals reflected from objects in an environment. Each receiver has a controller, a buffer, and a post-buffer processor. The receiver processes the received radio signals and stored data samples in the buffer. The buffer operates in a plurality of modes defined by the controller. Two or more modes of operation of the plurality of modes are performed with a same set of data samples stored in the buffer. The post-buffer processor receives data samples from the buffer and performs at least one of correlation processing to determine object ranges, Doppler processing to determine object velocity, and, in combination with other receivers of the plurality of receivers, further processing to determine angular locations of the objects.

15 Claims, 6 Drawing Sheets

Related U.S. Application Data

(60) Provisional application No. 62/457,394, filed on Feb. 10, 2017.

(51) Int. Cl.
| | |
|---|---|
| *G01S 7/285* | (2006.01) |
| *G01S 13/931* | (2020.01) |
| *G01S 13/06* | (2006.01) |
| *G01S 7/03* | (2006.01) |
| *G01S 13/87* | (2006.01) |
| *G01S 13/42* | (2006.01) |
| *G01S 13/58* | (2006.01) |
| *G11C 11/409* | (2006.01) |
| *G01S 7/40* | (2006.01) |
| *G01S 13/32* | (2006.01) |
| *G01S 13/34* | (2006.01) |
| *G06F 7/72* | (2006.01) |

(52) U.S. Cl.
CPC .............. *G01S 13/06* (2013.01); *G01S 13/42* (2013.01); *G01S 13/584* (2013.01); *G01S 13/64* (2013.01); *G01S 13/87* (2013.01); *G01S 13/931* (2013.01); *G11C 11/409* (2013.01); *G01S 7/4017* (2013.01); *G01S 7/4021* (2013.01); *G01S 13/325* (2013.01); *G01S 13/34* (2013.01); *G01S 13/878* (2013.01); *G01S 2013/93271* (2020.01); *G01S 2013/93272* (2020.01); *G01S 2013/93274* (2020.01); *G06F 7/724* (2013.01)

(58) Field of Classification Search
CPC ........ G01S 13/42; G01S 13/584; G01S 13/64; G01S 13/87; G01S 7/4017; G01S 7/4021; G01S 13/325; G01S 13/34; G01S 13/878; G01S 2013/93271; G01S 2013/93272; G01S 2013/93274; G11C 11/409; G06F 7/724
See application file for complete search history.

(56) References Cited

U.S. PATENT DOCUMENTS

| | | | |
|---|---|---|---|
| 3,735,398 A | 5/1973 | Ross | |
| 3,750,169 A | 7/1973 | Strenglein | |
| 3,896,434 A | 7/1975 | Sirven | |
| 4,078,234 A | 3/1978 | Fishbein et al. | |
| 4,176,351 A | 11/1979 | De Vita et al. | |
| 4,566,010 A | 1/1986 | Collins | |
| 4,882,668 A | 11/1989 | Schmid et al. | |
| 4,910,464 A | 3/1990 | Trett et al. | |
| 4,939,685 A | 7/1990 | Feintuch | |
| 5,001,486 A | 3/1991 | Bächtiger | |
| 5,034,906 A | 7/1991 | Chang | |
| 5,087,918 A | 2/1992 | May et al. | |
| 5,151,702 A | 9/1992 | Urkowitz | |
| 5,175,710 A | 12/1992 | Hutson | |
| 5,218,619 A | 6/1993 | Dent | |
| 5,272,663 A | 12/1993 | Jones et al. | |
| 5,280,288 A | 1/1994 | Sherry et al. | |
| 5,302,956 A | 4/1994 | Asbury et al. | |
| 5,341,141 A | 8/1994 | Frazier et al. | |
| 5,345,470 A | 9/1994 | Alexander | |
| 5,376,939 A | 12/1994 | Urkowitz | |
| 5,379,322 A | 1/1995 | Kosaka et al. | |
| 5,497,162 A | 3/1996 | Kaiser | |
| 5,508,706 A | 4/1996 | Tsou et al. | |
| 5,581,464 A | 12/1996 | Woll et al. | |
| 5,657,021 A | 8/1997 | Ehsani-Nategh et al. | |
| 5,657,023 A | 8/1997 | Lewis et al. | |
| 5,691,724 A | 11/1997 | Aker et al. | |
| 5,712,640 A | 1/1998 | Andou | |
| 5,724,041 A | 3/1998 | Inoue et al. | |
| 5,892,477 A | 4/1999 | Wehling | |
| 5,907,302 A * | 5/1999 | Melvin, Jr. | G01S 13/5244 342/162 |
| 5,917,430 A | 6/1999 | Greneker, III et al. | |
| 5,920,285 A | 7/1999 | Benjamin | |
| 5,931,893 A | 8/1999 | Dent et al. | |
| 5,959,571 A | 9/1999 | Aoyagi et al. | |
| 5,970,400 A | 10/1999 | Dwyer | |
| 6,067,314 A | 5/2000 | Azuma | |
| 6,069,581 A | 5/2000 | Bell et al. | |
| 6,121,872 A | 9/2000 | Weishaupt | |
| 6,121,918 A | 9/2000 | Tullsson | |
| 6,151,366 A | 11/2000 | Yip | |
| 6,163,252 A | 12/2000 | Nishiwaki | |
| 6,184,829 B1 | 2/2001 | Stilp | |
| 6,191,726 B1 | 2/2001 | Tullsson | |
| 6,288,672 B1 | 9/2001 | Asano et al. | |
| 6,307,622 B1 | 10/2001 | Lewis | |
| 6,347,264 B2 | 2/2002 | Nicosia et al. | |
| 6,400,308 B1 | 6/2002 | Bell et al. | |
| 6,411,250 B1 | 6/2002 | Oswald et al. | |
| 6,417,796 B1 | 7/2002 | Bowlds | |
| 6,424,289 B2 | 7/2002 | Fukae et al. | |
| 6,583,753 B1 | 6/2003 | Reed | |
| 6,614,387 B1 | 9/2003 | Deadman | |
| 6,624,784 B1 | 9/2003 | Yamaguchi | |
| 6,674,908 B1 | 1/2004 | Aronov | |
| 6,714,956 B1 | 3/2004 | Liu et al. | |
| 6,747,595 B2 | 6/2004 | Hirabe | |
| 6,768,391 B1 | 7/2004 | Dent et al. | |
| 6,865,218 B1 | 3/2005 | Sourour | |
| 6,867,732 B1 * | 3/2005 | Chen | G01S 7/292 342/159 |
| 6,975,246 B1 | 12/2005 | Trudeau | |
| 7,119,739 B1 | 10/2006 | Struckman | |
| 7,289,058 B2 | 10/2007 | Shima | |
| 7,299,251 B2 | 11/2007 | Skidmore et al. | |
| 7,338,450 B2 | 3/2008 | Kristofferson et al. | |
| 7,395,084 B2 | 7/2008 | Anttila | |
| 7,460,055 B2 | 12/2008 | Nishijima et al. | |
| 7,474,258 B1 | 1/2009 | Arikan et al. | |
| 7,545,310 B2 | 6/2009 | Matsuoka | |
| 7,545,321 B2 | 6/2009 | Kawasaki | |
| 7,564,400 B2 | 7/2009 | Fukuda | |
| 7,567,204 B2 | 7/2009 | Sakamoto | |
| 7,609,198 B2 | 10/2009 | Chang | |
| 7,642,952 B2 | 1/2010 | Fukuda | |
| 7,663,533 B2 | 2/2010 | Toennesen | |
| 7,728,762 B2 | 6/2010 | Sakamoto | |
| 7,791,528 B2 | 9/2010 | Klotzbuecher | |
| 7,847,731 B2 | 12/2010 | Wiesbeck et al. | |
| 7,855,677 B2 | 12/2010 | Negoro et al. | |
| 7,859,450 B2 | 12/2010 | Shirakawa et al. | |
| 7,916,068 B2 * | 3/2011 | Wicks | G01S 13/5248 342/162 |
| 8,019,352 B2 | 9/2011 | Rappaport et al. | |
| 8,049,663 B2 | 11/2011 | Frank et al. | |
| 8,059,026 B1 | 11/2011 | Nunez | |
| 8,102,306 B2 | 1/2012 | Smith, Jr. et al. | |
| 8,154,436 B2 | 4/2012 | Szajnowski | |
| 8,330,650 B2 | 12/2012 | Goldman | |
| 8,390,507 B2 | 3/2013 | Wintermantel | |
| 8,471,760 B2 | 6/2013 | Szajnowski | |
| 8,532,159 B2 | 9/2013 | Kagawa et al. | |
| 8,547,988 B2 | 10/2013 | Hadani et al. | |
| 8,686,894 B2 | 4/2014 | Fukuda et al. | |
| 8,694,306 B1 | 4/2014 | Short et al. | |
| 9,121,943 B2 | 9/2015 | Stirlin-Gallacher et al. | |
| 9,239,378 B2 | 1/2016 | Kishigami et al. | |
| 9,239,379 B2 | 1/2016 | Burgio et al. | |
| 9,282,945 B2 | 3/2016 | Smith et al. | |
| 9,335,402 B2 | 5/2016 | Maeno et al. | |
| 9,541,639 B2 | 1/2017 | Searcy et al. | |
| 9,568,600 B2 | 2/2017 | Alland | |
| 9,575,160 B1 | 2/2017 | Davis et al. | |
| 9,599,702 B1 | 3/2017 | Bordes et al. | |
| 9,689,967 B1 | 6/2017 | Stark et al. | |
| 9,720,073 B1 | 8/2017 | Davis et al. | |

(56) References Cited

U.S. PATENT DOCUMENTS

| | | |
|---|---|---|
| 9,753,121 B1 | 9/2017 | Davis |
| 9,753,132 B1 | 9/2017 | Bordes et al. |
| 9,759,808 B2 * | 9/2017 | Nayyar ................. G01S 13/343 |
| 9,772,397 B1 | 9/2017 | Bordes et al. |
| 9,791,551 B1 | 10/2017 | Eshraghi et al. |
| 9,791,564 B1 | 10/2017 | Harris et al. |
| 9,806,914 B1 | 10/2017 | Bordes et al. |
| 9,829,567 B1 | 11/2017 | Davis et al. |
| 9,846,228 B2 | 12/2017 | Davis et al. |
| 9,869,762 B1 | 1/2018 | Alland et al. |
| 2001/0002919 A1 | 6/2001 | Sourour et al. |
| 2002/0004692 A1 | 1/2002 | Nicosia et al. |
| 2002/0044082 A1 | 4/2002 | Woodington et al. |
| 2002/0075178 A1 | 6/2002 | Woodington et al. |
| 2002/0118522 A1 | 8/2002 | Ho et al. |
| 2002/0130811 A1 | 9/2002 | Voigtaender |
| 2002/0147534 A1 | 10/2002 | Delcheccolo et al. |
| 2002/0155811 A1 | 10/2002 | Prismantas |
| 2003/0001772 A1 | 1/2003 | Woodington et al. |
| 2003/0011519 A1 | 1/2003 | Breglia et al. |
| 2003/0058166 A1 | 3/2003 | Hirabe |
| 2003/0080713 A1 | 5/2003 | Kirmuss |
| 2003/0102997 A1 | 6/2003 | Levin et al. |
| 2003/0235244 A1 | 12/2003 | Pessoa et al. |
| 2004/0012516 A1 | 1/2004 | Schiffmann |
| 2004/0015529 A1 | 1/2004 | Tanrikulu et al. |
| 2004/0066323 A1 | 4/2004 | Richter |
| 2004/0138802 A1 | 7/2004 | Kuragaki et al. |
| 2005/0069162 A1 | 3/2005 | Haykin |
| 2005/0156780 A1 | 7/2005 | Bonthron et al. |
| 2005/0201457 A1 | 9/2005 | Allred et al. |
| 2005/0225476 A1 | 10/2005 | Hoetzel et al. |
| 2006/0012511 A1 | 1/2006 | Dooi et al. |
| 2006/0036353 A1 | 2/2006 | Wintermantel |
| 2006/0050707 A1 | 3/2006 | Sterin |
| 2006/0093078 A1 | 5/2006 | Lewis et al. |
| 2006/0109170 A1 | 5/2006 | Voigtlaender et al. |
| 2006/0109931 A1 | 5/2006 | Asai |
| 2006/0114324 A1 | 6/2006 | Farmer et al. |
| 2006/0140249 A1 | 6/2006 | Kohno |
| 2006/0181448 A1 | 8/2006 | Natsume et al. |
| 2006/0244653 A1 | 11/2006 | Szajnowski |
| 2006/0262007 A1 | 11/2006 | Bonthron |
| 2006/0262009 A1 | 11/2006 | Watanabe |
| 2007/0018884 A1 | 1/2007 | Adams |
| 2007/0018886 A1 | 1/2007 | Watanabe et al. |
| 2007/0109175 A1 | 5/2007 | Fukuda |
| 2007/0120731 A1 | 5/2007 | Kelly, Jr. et al. |
| 2007/0132633 A1 | 6/2007 | Uchino |
| 2007/0152870 A1 | 7/2007 | Woodington et al. |
| 2007/0152871 A1 | 7/2007 | Puglia |
| 2007/0152872 A1 | 7/2007 | Woodington |
| 2007/0164896 A1 | 7/2007 | Suzuki et al. |
| 2007/0171122 A1 | 7/2007 | Nakano |
| 2007/0182619 A1 | 8/2007 | Honda et al. |
| 2007/0182623 A1 | 8/2007 | Zeng |
| 2007/0188373 A1 | 8/2007 | Shirakawa et al. |
| 2007/0200747 A1 | 8/2007 | Okai |
| 2007/0279303 A1 | 12/2007 | Schoebel |
| 2008/0208472 A1 | 8/2008 | Morcom |
| 2008/0272955 A1 | 11/2008 | Yonak et al. |
| 2009/0015459 A1 | 1/2009 | Mahler et al. |
| 2009/0015464 A1 | 1/2009 | Fukuda |
| 2009/0051581 A1 | 2/2009 | Hatono |
| 2009/0072957 A1 | 3/2009 | Wu et al. |
| 2009/0073025 A1 | 3/2009 | Inoue et al. |
| 2009/0074031 A1 | 3/2009 | Fukuda |
| 2009/0079617 A1 | 3/2009 | Shirakawa et al. |
| 2009/0085827 A1 | 4/2009 | Orime et al. |
| 2009/0103593 A1 | 4/2009 | Bergamo |
| 2009/0121918 A1 | 5/2009 | Shirai et al. |
| 2009/0212998 A1 | 8/2009 | Szajnowski |
| 2009/0237293 A1 | 9/2009 | Sakuma |
| 2009/0267822 A1 | 10/2009 | Shinoda et al. |
| 2009/0289831 A1 | 11/2009 | Akita |
| 2009/0295623 A1 | 12/2009 | Falk |
| 2010/0019950 A1 | 1/2010 | Yamano et al. |
| 2010/0116365 A1 | 5/2010 | McCarty |
| 2010/0156690 A1 | 6/2010 | Kim et al. |
| 2010/0198513 A1 | 8/2010 | Zeng et al. |
| 2010/0277359 A1 | 11/2010 | Ando |
| 2010/0289692 A1 | 11/2010 | Winkler |
| 2011/0006944 A1 | 1/2011 | Goldman |
| 2011/0032138 A1 | 2/2011 | Krapf |
| 2011/0074620 A1 | 3/2011 | Wintermantel |
| 2011/0187600 A1 | 8/2011 | Landt |
| 2011/0196568 A1 | 8/2011 | Nickolaou |
| 2011/0248796 A1 | 10/2011 | Pozgay |
| 2011/0279303 A1 | 11/2011 | Smith, Jr. et al. |
| 2011/0279307 A1 | 11/2011 | Song |
| 2011/0285576 A1 | 11/2011 | Lynam |
| 2011/0291874 A1 | 12/2011 | De Mersseman |
| 2011/0291875 A1 | 12/2011 | Szajnowski |
| 2011/0292971 A1 | 12/2011 | Hadani et al. |
| 2011/0298653 A1 | 12/2011 | Mizutani |
| 2012/0001791 A1 | 1/2012 | Wintermantel |
| 2012/0050093 A1 | 3/2012 | Heilmann et al. |
| 2012/0105268 A1 | 5/2012 | Smits et al. |
| 2012/0112957 A1 | 5/2012 | Nguyen et al. |
| 2012/0133547 A1 | 5/2012 | MacDonald et al. |
| 2012/0173246 A1 | 7/2012 | Choi et al. |
| 2012/0195349 A1 | 8/2012 | Lakkis |
| 2012/0257643 A1 | 10/2012 | Wu et al. |
| 2012/0319900 A1 | 12/2012 | Johansson et al. |
| 2013/0016761 A1 | 1/2013 | Nentwig |
| 2013/0021196 A1 | 1/2013 | Himmelstoss |
| 2013/0027240 A1 | 1/2013 | Chowdhury |
| 2013/0069818 A1 | 3/2013 | Shirakawa et al. |
| 2013/0102254 A1 | 4/2013 | Cyzs |
| 2013/0113653 A1 | 5/2013 | Kishigami et al. |
| 2013/0135140 A1 | 5/2013 | Kishigami |
| 2013/0169485 A1 | 7/2013 | Lynch |
| 2013/0176154 A1 | 7/2013 | Bonaccio et al. |
| 2013/0214961 A1 | 8/2013 | Lee et al. |
| 2013/0229301 A1 | 9/2013 | Kanamoto |
| 2013/0244710 A1 | 9/2013 | Nguyen et al. |
| 2013/0249730 A1 | 9/2013 | Adcook |
| 2013/0314271 A1 | 11/2013 | Braswell et al. |
| 2013/0321196 A1 | 12/2013 | Binzer et al. |
| 2014/0022108 A1 | 1/2014 | Alberth, Jr. et al. |
| 2014/0028491 A1 | 1/2014 | Ferguson |
| 2014/0035774 A1 | 2/2014 | Khlifi |
| 2014/0070985 A1 | 3/2014 | Vacanti |
| 2014/0085128 A1 | 3/2014 | Kishigami et al. |
| 2014/0111372 A1 | 4/2014 | Wu |
| 2014/0139322 A1 | 5/2014 | Wang et al. |
| 2014/0159948 A1 | 6/2014 | Ishimori et al. |
| 2014/0220903 A1 | 8/2014 | Schulz et al. |
| 2014/0253345 A1 | 9/2014 | Breed |
| 2014/0285373 A1 | 9/2014 | Kuwahara et al. |
| 2014/0327566 A1 | 11/2014 | Burgio et al. |
| 2014/0348253 A1 | 11/2014 | Mobasher et al. |
| 2015/0002329 A1 | 1/2015 | Murad et al. |
| 2015/0002357 A1 | 1/2015 | Sanford et al. |
| 2015/0035662 A1 | 2/2015 | Bowers et al. |
| 2015/0061922 A1 | 3/2015 | Kishigami |
| 2015/0103745 A1 | 4/2015 | Negus et al. |
| 2015/0198709 A1 | 7/2015 | Inoue |
| 2015/0204966 A1 | 7/2015 | Kishigami |
| 2015/0204971 A1 | 7/2015 | Kuehnle |
| 2015/0226848 A1 | 8/2015 | Park |
| 2015/0234045 A1 | 8/2015 | Rosenblum |
| 2015/0247924 A1 | 9/2015 | Kishigami |
| 2015/0255867 A1 | 9/2015 | Inoue |
| 2015/0301172 A1 | 10/2015 | Ossowska |
| 2015/0309167 A1 * | 10/2015 | Shikatani ................. G01S 13/18 342/27 |
| 2015/0323660 A1 | 11/2015 | Hampikian |
| 2015/0331090 A1 | 11/2015 | Jeong et al. |
| 2015/0346321 A1 * | 12/2015 | Jansen ..................... G01S 7/02 342/107 |
| 2016/0003939 A1 | 1/2016 | Stainvas Olshansky et al. |
| 2016/0018511 A1 | 1/2016 | Nayyar et al. |
| 2016/0033631 A1 | 2/2016 | Searcy et al. |

(56) References Cited

U.S. PATENT DOCUMENTS

| | | |
|---|---|---|
| 2016/0033632 A1 | 2/2016 | Searcy et al. |
| 2016/0041260 A1 | 2/2016 | Cao et al. |
| 2016/0061935 A1 | 3/2016 | McCloskey et al. |
| 2016/0084941 A1 | 3/2016 | Arage |
| 2016/0084943 A1 | 3/2016 | Arage |
| 2016/0091595 A1 | 3/2016 | Alcalde |
| 2016/0124086 A1 | 5/2016 | Jansen et al. |
| 2016/0139254 A1 | 5/2016 | Wittenberg |
| 2016/0146931 A1 | 5/2016 | Rao et al. |
| 2016/0154103 A1 | 6/2016 | Moriuchi |
| 2016/0223665 A1* | 8/2016 | Winstead ............... G01S 13/582 |
| 2016/0238694 A1 | 8/2016 | Kishigami |
| 2017/0010361 A1 | 1/2017 | Tanaka |
| 2017/0023661 A1 | 1/2017 | Richert |
| 2017/0023663 A1 | 1/2017 | Subburaji et al. |
| 2017/0074980 A1 | 3/2017 | Adib |
| 2017/0153316 A1 | 6/2017 | Wintermantel |
| 2017/0219689 A1 | 8/2017 | Hung et al. |
| 2017/0234968 A1 | 8/2017 | Roger et al. |
| 2017/0293025 A1 | 10/2017 | Davis et al. |
| 2017/0293027 A1 | 10/2017 | Stark et al. |
| 2017/0307728 A1 | 10/2017 | Eshraghi et al. |
| 2017/0309997 A1 | 10/2017 | Alland et al. |
| 2017/0310758 A1 | 10/2017 | Davis et al. |
| 2017/0336495 A1 | 11/2017 | Davis et al. |
| 2017/0350971 A1* | 12/2017 | Winstead ............... G01S 13/605 |
| 2018/0074187 A1* | 3/2018 | Winstead ............... G01S 13/585 |

FOREIGN PATENT DOCUMENTS

| | | |
|---|---|---|
| EP | 2821808 | 7/2015 |
| FR | 2751086 | 1/1998 |
| WO | WO2015175078 | 11/2015 |
| WO | WO2015185058 | 12/2015 |
| WO | WO2016011407 | 1/2016 |
| WO | WO2016030656 | 3/2016 |
| WO | WO2017187330 | 11/2017 |

OTHER PUBLICATIONS

Fraser, "Design and simulation of a coded sequence ground penetrating radar," In: Diss. University of British Columbia, Dec. 3, 2015.

Zhou et al., "Linear extractors for extracting randomness from noisy sources," In: Information Theory Proceedings (ISIT), 2011 IEEE International Symposium on Oct. 3, 2011.

V. Giannini et al., "A 79 GHz Phase-Modulated 4 GHz-BW CW Radar Transmitter in 28 nm CMOS,"in IEEE Journal of Solid-State Circuits, vol. 49, No. 12, pp. 2925-2937, Dec. 2014. (Year: 2014).

International Search Report of the International Searching Authority from corresponding Patent Cooperation Treaty (PCT) Application No. PCT/IB18/50819, indicated completed on May 23, 2018.

Written Opinion of the International Searching Authority from corresponding Patent Cooperation Treaty (PCT) Application No. PCT/IB18/50819, indicated completed on May 23, 2018.

* cited by examiner

RADAR DATA BUFFERING

CROSS REFERENCE TO RELATED APPLICATIONS

This application is a continuation of U.S. patent application Ser. No. 15/892,764, filed Feb. 9, 2018, now U.S. Pat. No. 9,971,020, which claims the filing benefits of U.S. provisional application, Ser. No. 62/457,394, filed Feb. 10, 2017, which are both hereby incorporated by reference herein in their entireties.

FIELD OF THE INVENTION

The present invention is directed to radar systems, and in particular to radar systems for vehicles.

BACKGROUND OF THE INVENTION

The use of radar to determine range, velocity, and angle (elevation or azimuth) of objects in an environment is important in a number of applications including automotive radar and gesture detection. Radar typically transmits a radio frequency (RF) signal and listens for the reflection of the radio signal from objects in the environment. A radar system estimates the location of objects, also called targets, in an environment by correlating delayed versions of the received radio signal with the transmitted radio signal. A radar system can also estimate the velocity of the target by Doppler processing. A radar system with multiple transmitters and multiple receivers can also determine the angular position of a target.

A radar system consists of transmitters and receivers. The transmitters generate a baseband signal which is up-converted to a radio frequency (RF) signal that propagates according to an antenna pattern. The transmitted signal is reflected off of objects or targets in the environment. The received signal at each receiver is the totality of the reflected signal from all targets in the environment. The receiver down converts the received signal to baseband and compares the baseband received signal to the baseband signal at one or more transmitters. This is used to determine the range, velocity and angle of targets in the environment.

SUMMARY OF THE INVENTION

The present invention provides methods and a system for achieving better performance in a radar system implemented as a modulated continuous wave radar. An exemplary radar system of the present invention is a radar system for a vehicle that includes multiple transmitters and receivers, implemented as a multiple-input, multiple-output (MIMO) radar system. Each exemplary receiver of the radar system comprises a receive front end, an analog-to-digital converter (ADC), a pre-buffer signal processing unit to process samples from the ADC, and a buffer configured to hold data samples for processing by a post-buffer signal processor. An exemplary buffer is configured to selectively operate in one of several possible processing modes, such as a replay mode, a loopback mode, a quiet mode, and throttle modes. These selectable modes for the buffer provide for an improved operation of the receiver in detecting objects in an environment by allowing the receivers to process the data samples in a variety of ways. In an aspect of the invention, a same set of stored data samples may be processed a number of different ways.

A radar sensing system for a vehicle in accordance with an embodiment of the present invention includes a plurality of transmitters and a plurality of receivers. The transmitters are configured for installation and use on a vehicle and configured to transmit radio signals. The receivers are configured for installation and use on the vehicle and are configured to receive radio signals which include transmitted radio signals transmitted by the transmitters and reflected from objects in an environment. Each receiver includes an antenna, a radio frequency front end, an analog-to-digital converter (ADC), and a controller. The receiver is structured as a pipeline where one subsystem processes input data and generate output data processed by another subsystem. Part of the pipeline includes a pre-buffer processor that processes the data from the ADC. Another part of the pipeline is a buffer which stores the data samples related to the output of the analog-to-digital converter. The buffer can operate in several modes, as defined by the controller. These modes include replay mode, loopback mode, quiet mode, and throttle mode. The buffer can also feed information back to the pre-buffer processor.

A radar sensing system for a vehicle in accordance with an embodiment of the present invention includes a plurality of transmitters, a plurality of receivers, and a controller. The plurality of transmitters are configured for installation and use on a vehicle and configured to transmit radio signals. The plurality of receivers are configured for installation and use on the vehicle and configured to receive radio signals that include the transmitted radio signals transmitted by the transmitters and reflected from objects in an environment. The controller is configured to control the transmitters and the receivers. Each receiver comprises (i) a radio frequency (RF) front end configured to process the received radio signals to output processed radio signals; (ii) an analog-to-digital converter (ADC) configured to receive the processed radio signals and output data samples related to the processed radio signals; (iii) a pre-buffer signal processing unit configured to perform correlations; (iv) a buffer configured to store the data samples output by the ADC; and (v) a post-buffer processor configured to receive data samples output from the buffer. The buffer is configured to operate in one of several modes, as defined by the controller. The buffer is further configured to selectively output the stored data samples, as defined by the controller. The post-buffer processor is configured to perform at least one of range processing, velocity processing, and angular processing on the stored data samples, as defined by the controller.

A method for controlling a radar sensing system for a vehicle in accordance with an embodiment of the present invention includes providing a radar system that includes a plurality of transmitters configured for installation and use on a vehicle and a plurality of receivers configured for installation and use on the vehicle. The method includes transmitting, with the transmitters, radio signals, and receiving, with the receivers, radio signals that include the transmitted radio signals transmitted by the transmitters and reflected from objects in an environment. The method further includes processing, with a radio frequency (RF) front end of a first receiver of the plurality of receivers, the received radio signals and outputting processed radio signals. Processing the radio signals with an analog-to-digital converter (ADC) and outputting data samples. Processing the ADC samples with a first signal processor. The processed ADC samples are stored in a buffer of the first receiver. One of several operational modes are selected for the buffer, and stored data samples are outputted as defined by the selected operational mode. Performing, with a post-buffer processor of the first receiver, at least one of range processing, velocity processing, and angular processing on the stored data samples.

In an aspect of the present invention, the buffer replays the same sequence of samples a plurality of times, such that the same data samples are processed a number of different ways.

In an aspect of the present invention, a post-buffer processing unit is put into a sleep mode while a pre-buffer processor is actively storing data samples into the buffer.

In a further aspect of the present invention, post-buffer processing includes a method for selectively scaling the amplitudes of the data samples. The scaling comprises setting the values of one or more data samples to a value of zero.

In yet another aspect of the present invention, the data stored in the buffer is used for calibrating at least one of a radio frequency portion and a digital processing portion of the RF front end.

In another aspect of the present invention, a cyclic redundancy check (CDC) is evaluated on data subsequent to post-buffer processing.

These and other objects, advantages, purposes and features of the present invention will become apparent upon review of the following specification in conjunction with the drawings.

DESCRIPTION OF THE PREFERRED EMBODIMENTS

The present invention will now be described with reference to the accompanying figures, wherein numbered elements in the following written description correspond to like-numbered elements in the figures. Methods and systems of the present invention may achieve better performance from an exemplary radar system by allowing data collected by the radar system to be processed in multiple ways. For example, targets may be detected in multiple sets of ranges (e.g., 0-40 meters and 100-300 meters) by processing the data multiple ways. Multiple processing may also be used to remove additional interference. The use of multiple processing allows for a more accurate determination of velocity information by providing multiple Doppler shifts to the stored data before estimating the Doppler shift of different targets.

Figure 1:
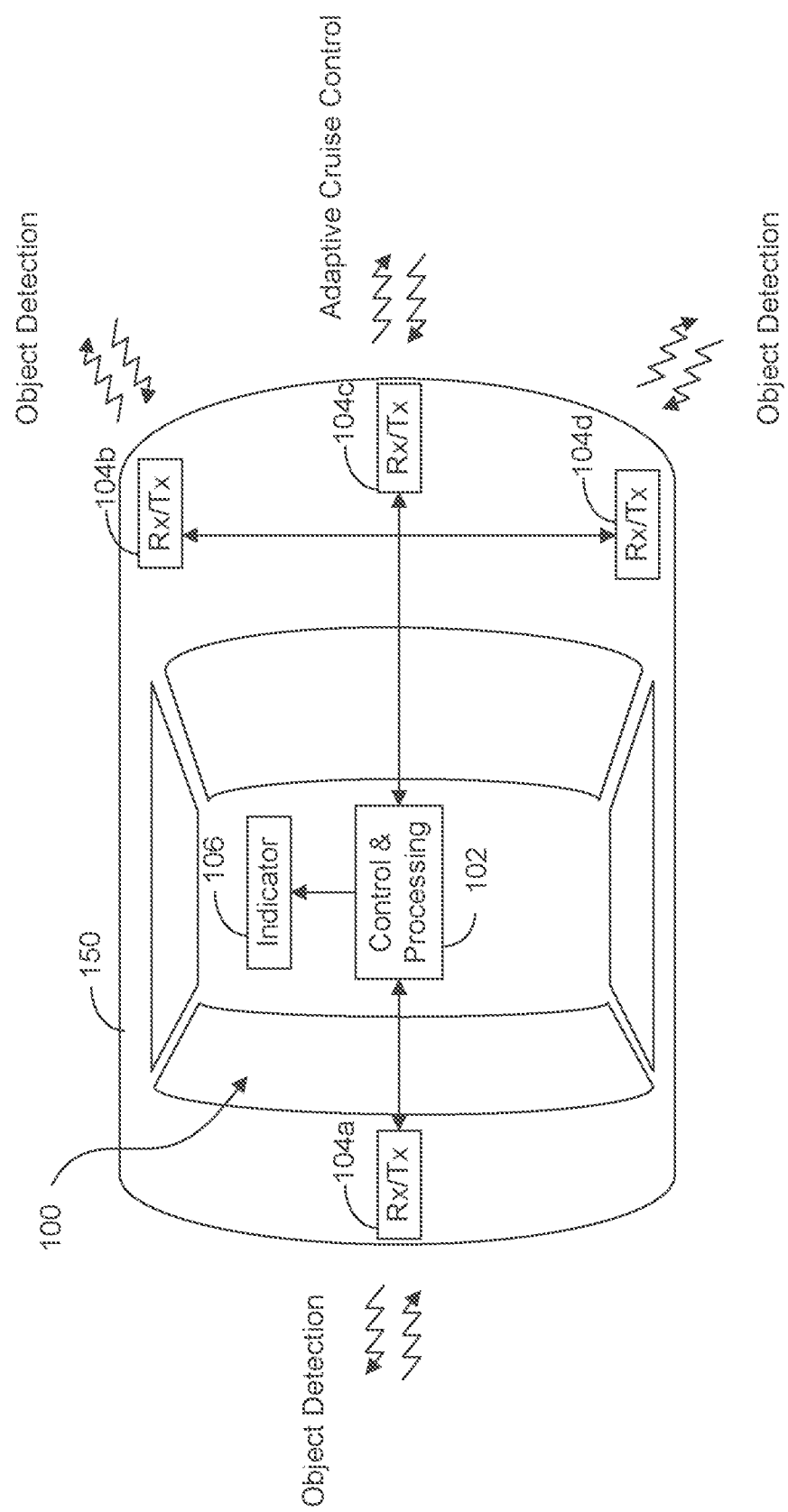
FIG. 1 is a plan view of an automobile equipped with a radar system in accordance with the present invention.

FIG. 1. Illustrates an exemplary radar system 100 configured for use in a vehicle 150. In an aspect of the present invention, a vehicle 150 may be an automobile, truck, or bus, etc. The radar system 100 may utilize multiple radar systems (e.g., 104a-104d) embedded into an automobile as illustrated in FIG. 1. Each of these radar systems may employ multiple transmitters, receivers, and antennas (see FIG. 3).

These signals are reflected from objects (also known as targets) in the environment and received by one or more receivers of the radar system. A transmitter-receiver pair is called a virtual radar (or sometimes a virtual receiver). As illustrated in FIG. 1, the radar system 100 may comprise one or more transmitters and one or more receivers 104a-104d for a plurality of virtual radars. Other configurations are also possible. FIG. 1 illustrates the receivers/transmitters 104a-104d placed to acquire and provide data for object detection and adaptive cruise control. As illustrated in FIG. 1, a controller 102 receives and the analyzes position information received from the receivers 104a-104d and forwards processed information (e.g., position information) to, for example, an indicator 106 or other similar devices, as well as to other automotive systems. The radar system 100 (providing such object detection and adaptive cruise control or the like) may be part of an Advanced Driver Assistance System (ADAS) for the automobile 150.

An exemplary radar system operates by transmitting one or more signals from one or more transmitters and then listening for reflections of those signals from objects in the environment by one or more receivers. By comparing the transmitted signals and the received signals, estimates of the range, velocity, and angle (azimuth and/or elevation) of the objects can be estimated.

There are several ways to implement a radar system. One way, illustrated in FIG. 2A uses a single antenna 202 for both transmitting and receiving radio signals. The antenna 202 is connected to a duplexer 204 that routes the appropriate signal from the antenna 202 to the receiver 208 or routes the signal from the transmitter 206 to the antenna 202. A control processor 210 controls the operation of the transmitter 206 and the receiver 208 and estimates the range and velocity of objects in the environment. A second way to implement a radar system is illustrated in FIG. 2B. In this system, there are separate antennas for transmitting (202A) and receiving (202B). A control processor 210 performs the same basic functions as in FIG. 2A. In each case, there may be a display 212 to visualize the location of objects in the environment.

Figure 3:
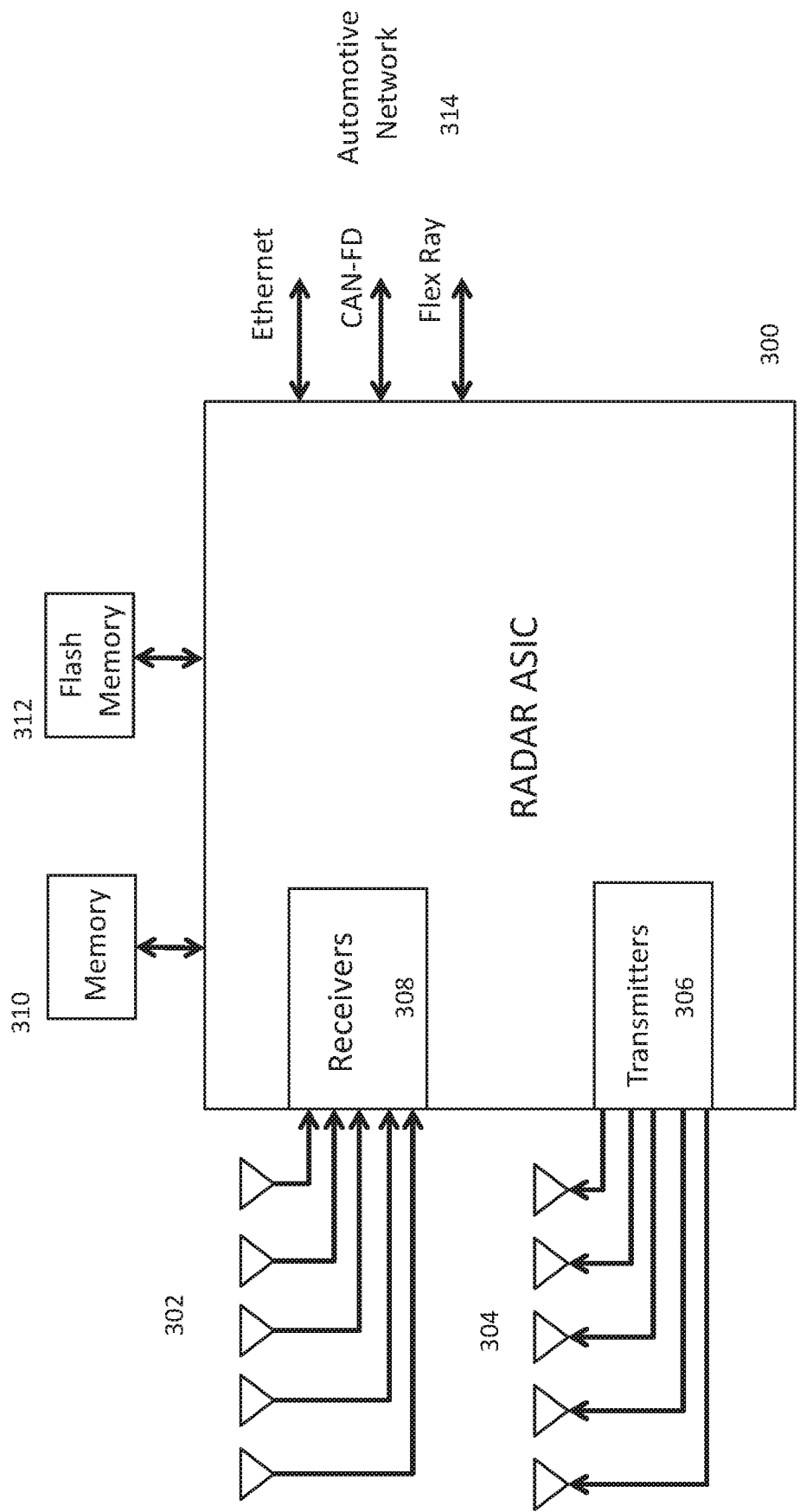
FIG. 3 is a block diagram illustrating a radar system with a plurality of receivers and a plurality of transmitters in accordance with the present invention.

A radar system with multiple antennas, transmitters and receivers is illustrated in FIG. 3. Using multiple antennas 302, 304 allows an exemplary radar system 300 to determine an angle (azimuth or elevation or both) of targets in the environment. Depending on the geometry of the antenna system, different angles (e.g., azimuth or elevation) can be determined.

The radar system 300 may be connected to a network via an Ethernet connection or other types of network connections 314, such as, for example, CAN-FD and FlexRay. The radar system 300 will have memory (310, 312) to store software and data used for processing the radio signals in order to determine range, velocity, and location of objects. Memory 310, 312 may also be used to store information about targets in the environment. There may also be processing capability contained in the ASIC 208 apart from the transmitters 203 and receivers 204.

An exemplary radar system includes NT transmitters and NR receivers for NT×NR virtual radars, one for each transmitter-receiver pair. For example, a radar system with eight transmitters and eight receivers will have 64 pairs or 64 virtual radars (with 64 virtual receivers). When three transmitters (Tx1, Tx2, Tx3) generate signals that are being received by three receivers (Rx1, Rx2, Rx3), each of the receivers is receiving the transmission from each of the transmitters reflected by objects in the environment. Each receiver can attempt to determine the range and Doppler of objects by correlating with delayed replicas of the signal from each of the transmitters. The physical receivers may then be "divided" into three separate virtual receivers, each virtual receiver correlating with delay replicas of one of the transmitted signals.

There are several different types of signals that transmitters in different types of radar systems employ. A radar system may transmit a pulsed signal or a continuous signal. In a pulsed radar system, a signal is transmitted for a short time during a first time period and then no signal is transmitted for a short time during a subsequent second time period. This is repeated over and over. When the signal is not being transmitted, the receiver listens for echoes or reflections from objects in the environment. Often a single antenna is used for both the transmitter and receiver. The radar transmits on the antenna and then listens to the received signal on the same antenna. This process is then repeated. In a continuous wave radar system, the signal is continuously transmitted. There may be an antenna for transmitting and a separate antenna for receiving. Another classification of radar systems is the modulation of the signal being transmitted. One type of modulation is frequency modulation (FM) while another type of modulation is phase modulation (PM). In a frequency modulated continuous wave (FMCW) radar system the transmitted signals are sinusoidal signals with varying frequency. By measuring the time difference between when a certain frequency was transmitted and when the received signal contained that frequency was received, the range to an object can be determined. By measuring several different time differences between a transmitted signal and a received signal, velocity information can be obtained.

A second type of continuous wave signal used in radar systems is a phase modulated continuous wave (PMCW) signal. In this type of radar system, the transmitted signal from a single transmitter is a sinusoidal signal in which the phase of the sinusoidal signal varies according to a certain pattern or code, sometimes called a spreading code, and is known at the PMCW radar receiver. The transmitted signal is phase modulated by mixing a baseband signal (e.g., with two values +1 and −1) with a local oscillator to generate a transmitted signal with a phase that is changing corresponding to the baseband signal. Typically, the phase during a given time period (called a chip period or chip duration) is one of a finite number of possible phases. A spreading code consisting of a sequence of chips, (e.g., +1, +1, −1, +1, −1, . . . ) that is mapped (e.g., +1→0, −1→π) into a sequence of phases (e.g., 0, 0, π, 0, π, . . . ) is used to modulate a carrier to generate the radio frequency (RF) signal. The spreading code could be a periodic sequence or could be a pseudo-random sequence with a very large period so it appears to be a nearly random sequence. The spreading code could be a binary code (e.g., +1 or −1). The resulting signal has a bandwidth that is proportional to the rate at which the phases change, called the chip rate $R_c$, which is the inverse of the chip duration $T_c=1/R_c$. By comparing the return signal to the transmitted signal the receiver can determine the range and the velocity of reflected objects.

In some radar systems the signal (e.g. a PMCW signal) is transmitted over a short time period (e.g. 1 microsecond) and then turned off for a similar time period. The receiver is only turned on during the time period where the transmitter is turned off. In this approach, reflections of the transmitted signal from very close targets will not be completely available because the receiver is not active during a large fraction of the time when the reflected signals are being received. This is called pulse mode.

The radar sensing system of the present invention may utilize aspects of the radar systems described in U.S. Pat. Nos. 9,954,955; 9,945,935; 9,869,762; 9,846,228; 9,806,914; 9,791,564; 9,791,551; 9,772,397; 9,753,121; 9,599,702; 9,575,160 and/or 9,689,967, and/or U.S. Publication No. US-2017-0309997; and/or U.S. patent application Ser. No. 15/496,038, filed Apr. 25, 2017, and/or Ser. No. 15/689,273, filed Aug. 29, 2017, and/or U.S. provisional application Ser. No. 62/486,732, filed Apr. 18, 2017, Ser. No. 62/528,789, filed Jul. 5, 2017, Ser. No. 62/573,880, filed Oct. 18, 2017, Ser. No. 62/598,563, filed Dec. 14, 2017, and/or Ser. No. 62/623,092, filed Jan. 29, 2018, which are all hereby incorporated by reference herein in their entireties.

Figure 4:
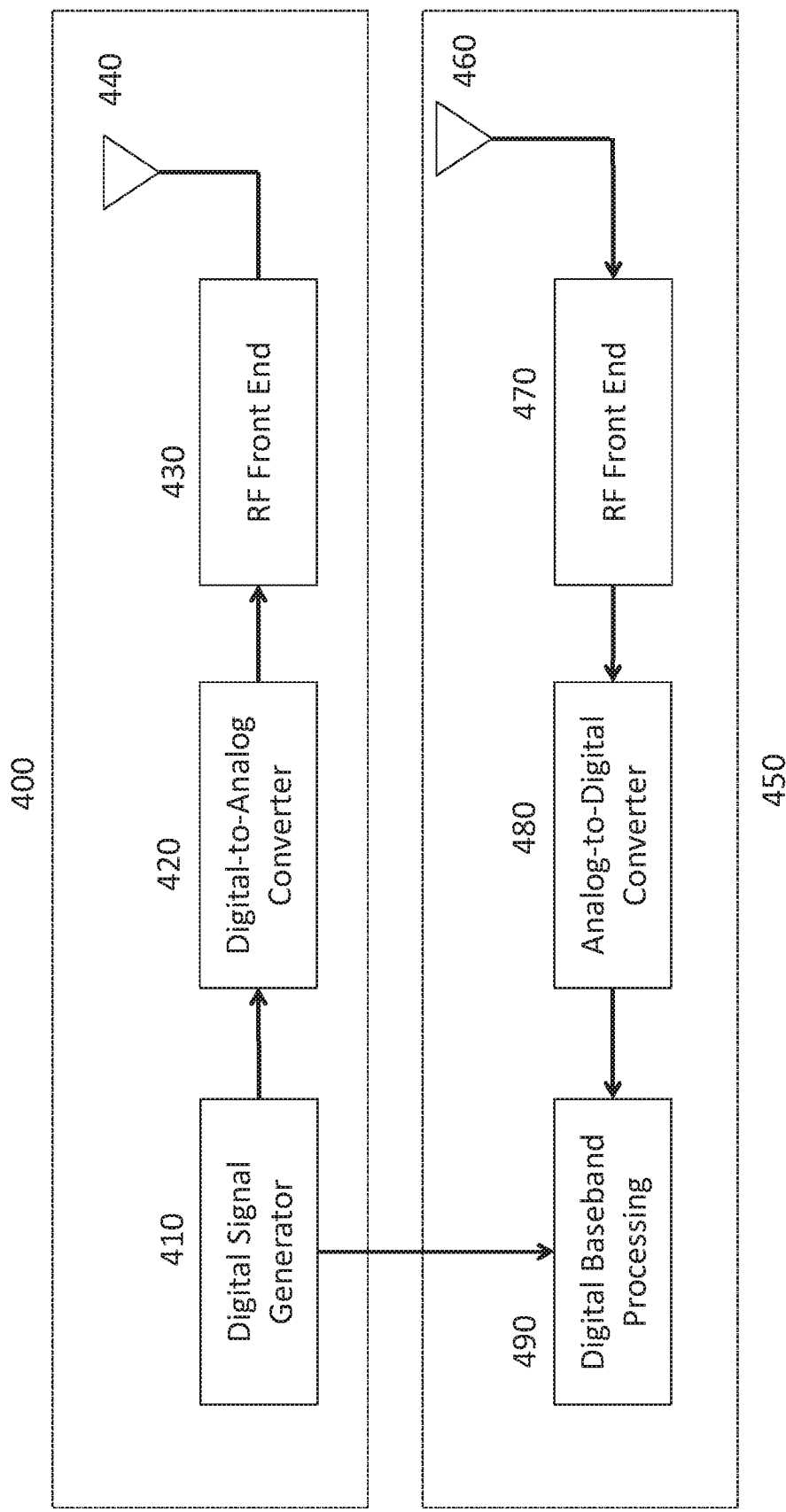
FIG. 4 is a block diagram of a receive pipeline and transmit pipeline of a radar system in accordance with the present invention.

An exemplary transmitter 400 and receiver 450 of a radar system is illustrated in FIG. 4. The transmitter 400 has a digital processor 410 that generates a baseband transmitted signal. The baseband signal is converted to an analog signal by a digital-to-analog converter (DAC) 420 and then mixed up to a carrier frequency and amplified by a radio frequency (RF) front end 430 before being radiated by an antenna 440. Each receiver 450 of the radar system generally will have a receive antenna 460, an analog RF front end 470, followed by an analog-to-digital converter (ADC) 480 that outputs complex valued digitized samples (i.e., values comprising a mathematical real component and a mathematical imaginary component), and then a digital baseband processing section 490.

Figure 5:
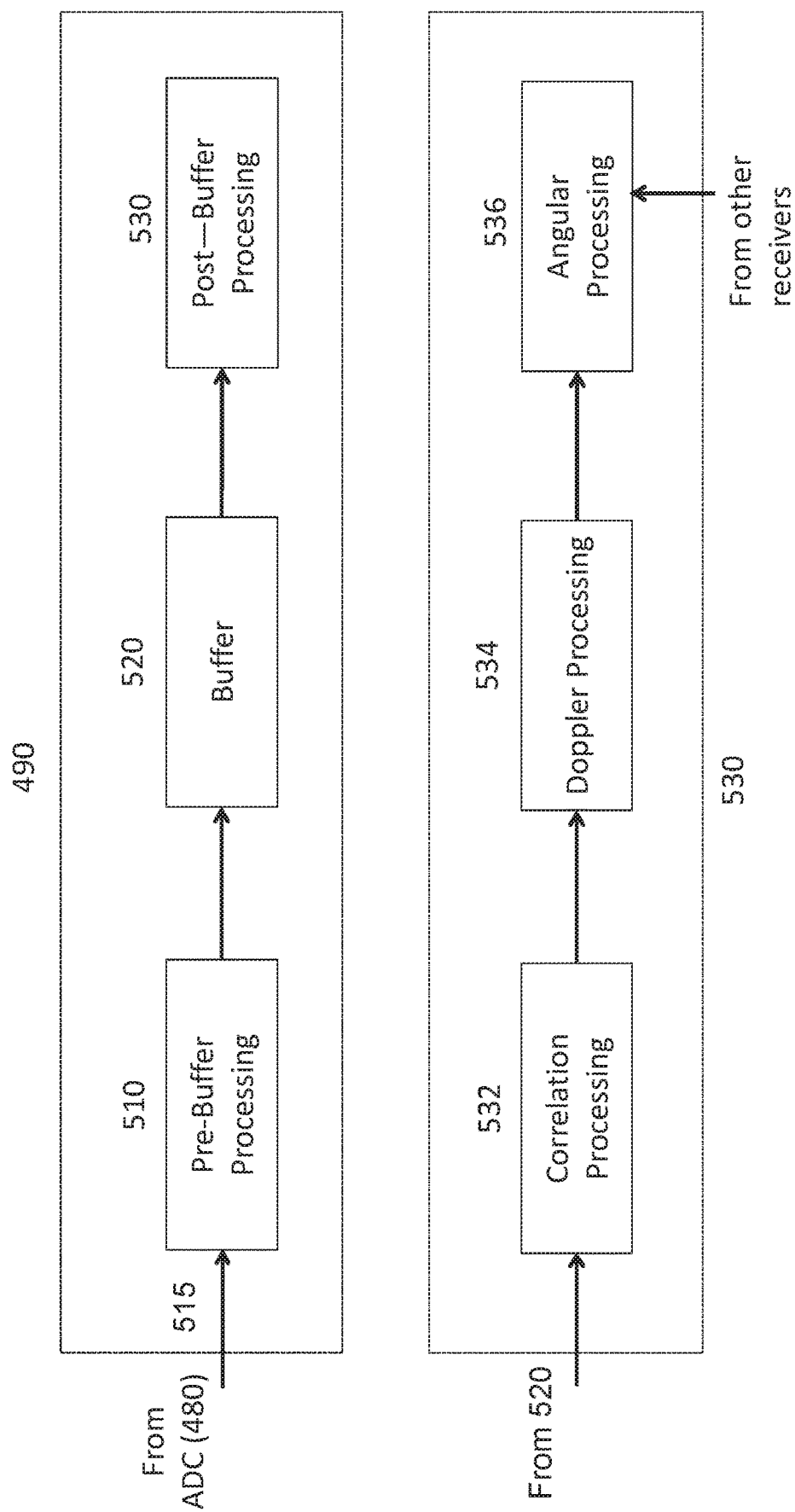
FIG. 5 is a block diagram of a digital processing section of the receive pipeline of FIG. 4 in accordance with the present invention.

As illustrated in FIG. 4, the digital baseband processing section 490 of the receiver 450 will processes samples from the ADC 480. This processing includes calculating correlations with different delays of the baseband signal for each of the possible transmitted baseband signals. There are a variety of ways that the correlation process can be accomplished, including matched filter and Fourier transform processing methods. This processing to calculate correlations can be done for a set of distances. Each delay of the baseband signal corresponds to a range for a target. A range bin is a range corresponding to a certain delay of the baseband signal used in a correlation. A correlation with a particular delay is an indication of whether or not a target is present at that particular range. For example, a spreading code might have a chip rate of $R_c$=500 Mchips/second which would correspond to a chip duration of $T_c$=2 nanoseconds. An exemplary receiver might perform correlation delays at intervals of 2 nanoseconds, starting with a delay of 2 nanoseconds up to a maximum delay of 256 nanoseconds. That is, 128 different correlations would be performed. A target at a distance of 30 meters would produce a delay of 200 nanoseconds. A correlation with the baseband spreading code at a delay of 100 chips (200 nanoseconds) would produce a large magnitude output because the reflected signal off of the target at 30 meters would produce a large correlation when the baseband spreading signal is delayed by 200 nanoseconds. A target at a distance of 30.3 meters would produce a large correlation with a baseband signal delayed by 101 chips (202 nanoseconds). Targets at a distance close to 30 meters (e.g. within ±0.15 meters) would produce larger outputs when correlated with a baseband signal delayed by 100 chips than when correlated with a baseband signal delayed by either 99 chips or 101 chips. The exemplary range bin corresponding to 30 meters would be of width 0.3 meters. An exemplary correlation unit might therefore be set up to produce a selected set of correlations (e.g. 128 correlations for range bins starting at 0.3 meters to a distance of 38.4 meters). In other words, as illustrated in FIG. 5, a correlation processing unit 532 may be configured to produce a selected quantity of correlations or to determine the presence of targets in a selected set of range bins. Furthermore, an exemplary correlation processing unit 532 could be configured to consider different sets of range bins to perform correlations over, such that the correlation unit 532 performs multiple correlations, each correlation performed over a selected set of range bins from the sets of range bins. As discussed herein, several different correlations may also be performed on a same set of data samples.

As illustrated in FIG. 5, an exemplary Doppler processing unit 534, part of the post-buffer processing unit 530, may be configured to determine a velocity of a target in a range bin by processing multiple correlation outputs up to a certain maximum Doppler shift, known as the maximum unambiguous Doppler or maximum unambiguous velocity. However, if some pre-processing is performed prior to the Doppler processing (e.g. by pre-rotating the samples), then a different set of possible velocities can be estimated.

As discussed herein, a receiver's correlation processing unit 532 may have a limitation on the quantity and or selection of range bins that can be processed. Similarly, the receiver's Doppler processing unit 534 may have a limitation on quantity and/or range of target velocities that can be estimated.

As illustrated in FIG. 5, an exemplary digital baseband processing section 490 is divided into three sections (510, 520, and 530). The first section is a pre-buffer processor 510 and processes the output of the ADC (480) in order to remove interference from other radars and possibly to change the sample rate of the ADC output. The second section is a buffer 520 configured to store data samples. The data buffer 520 is described in detail below. The last section is a post-buffer processor 530, which is configured to perform correlation processing to determine the ranges of targets, Doppler processing to determine the velocity of the targets, and then, in combination with other receivers, is further configured to determine angular locations of the targets.

Configured to store complex samples, an exemplary buffer 520 provides intermediate storage for incoming received signals as well as PRN TX sequences. This intermediate storage can be used in various modes, such as throttle, loopback, replay, and bypass, which are described in detail below. The buffer 520 may be configured as an intermediate memory and preferably stores 16,384 chips. Because the exemplary buffer 520 simultaneously supports a write operation as well as a read operation, the buffer 520 is configured to utilize two memories in a ping-pong fashion. Each memory of the buffer 520 preferably stores a data sample representing the 16,384 chips. In each memory location of the buffer 520, a complex sample may be stored from the pre-buffer processor 510, with the real and imaginary parts each represented using 11 bits for each of the receivers. In addition, the buffer 520 stores the spreading code for each of the possible transmitted signals (e.g. 12 bits for each chip corresponding to the 12 different transmitted signals). Therefore, the total number of bits stored is preferably 2×16,384× (11×2×8+12) bits=770,048 bytes=752 Kbytes for the ping-pong style memory (1 Kbyte=1024 bytes). The first factor of 2 is for the ping-pong memory. As discussed herein, there are 16,384 chips. Each chip requires the storing of I and Q samples of 11 bits each for each of the 8 receivers. Additionally, for each chip, 12 spreading code values are needed for the 12 different transmitters in order to perform the correlations.

The samples stored in the buffer 520 may be processed in various fashions or techniques. Different processing techniques may be configured to yield different range bins over which a correlation is to be calculated. Different processing techniques may also be used to produce different Doppler frequencies used to estimate the velocity of targets in the environment. It may also be advantageous to store these processed outputs rather than merely processing the samples and then discarding the samples (processed outputs) after the processing is complete.

In an aspect of the present invention, a variety of selectable modes of operation for an exemplary buffer 520 are available. One mode of operation is a "bypass mode." In this mode, data is passed to the next unit with almost no additional storage.

Another mode of operation is a "replay mode." In the replay mode, the buffer 520 "replays" the same data samples multiple times. This provides various options for further processing. The buffer 520 may also be used to play back data faster as compared to incoming data, and is therefore able to perform additional operations in the same amount of time. For example, if incoming data is stored at 250 Mchips/second, but the processing unit 530 is operating at 1 GHz, the same stored data can be replayed up to 4 times.

The data stored in the buffer 520 may also be replayed and then processed with different spreading code chips from different transmitters. If the correlation processor 532 for a set of 4 transmitters operates at 4 times the rate at which chips are accumulated in memory, then the correlation processor 532 would be able to process the spreading code chips from 16 transmitters without losing data.

By replaying the data from the buffer 520, correlations over multiple sets of range bins is possible. If the correlation processor 532, for example, can generate 256 range bins, the start/end of the TX code, or the RX code, or both, may be changed to increase the quantity of range bins. In addition, part of the previous or next PRI data may also be provided as necessary. If there is time for 4 replays (e.g. the processing speed of the correlation processor 532 is 4 times the rate at which samples are stored), the number of range bins may be increased from 256 to 1024.

By using the replay mode for the buffer operation in pulse mode described above, whereby the transmitter is ON for a short time interval and then OFF for another short interval, the receiver may detect targets in a first or initial processing. Knowing when the received signal samples correspond to reflections from near targets, those data samples (corresponding to the near targets) can be excised (set to 0). The correlation processing may then be repeated without the large samples from near targets. This allows for a better detection of far targets. In other words, once the large samples are removed from the set of data samples, the set of data samples may be processed again.

The replay mode may also be used to increase the unambiguous Doppler. By applying a frequency shift to the output of the buffer 520 before performing the Doppler processing (534), the set of Doppler frequency results shifts. For example, if the correlation samples are produced at a rate of 40,000 samples per second, the maximum unambiguous Doppler velocity is about 38 m/second (85 mph). The Doppler processor 534 would be able to estimate Doppler velocities between −38 m/s and +38 m/s. If the data out of the buffer 520 is multiplied on a chip-by-chip basis by an exemplary sinusoidal signal with a frequency of 40 kHz, corresponding to a Doppler velocity of 76 m/s, the Doppler processor 534 would be able to estimate Doppler velocities between +38 and +114 m/s.

A further mode of operation is "throttle mode 1." In this mode, the correlators 532 are operating on a partial duty cycle. If the ADC 480 produces 2 Gchips/s, the data is forwarded to the next processing block in the digital pipeline (the post-buffer processor 530) at a slower rate, e.g. 800 Megasamples-per-second (Ms/s). Only a part of the data stored in the buffer 520 is forwarded to the post-buffer processor 530. Therefore, the post-buffer processor 530 may operate at a 40% duty cycle.

Another mode of operation is "throttle mode 2." This mode is also throttling the received data from the pre-buffer processor 510 so that the correlation processor 532 can process the data at a lower rate (up to 800 Mchips/s). This mode ("throttle mode 2") may be used if the correlation processor 532 cannot match the speed of the pre-buffer processing 510, or for example, to bypass incoming data from the ADC 480 (which is arriving at up to 2 Gigasamples-per-second (Gs/s)), to supply data to the correlation unit 532 at a much lower rate.

Figure 2A:
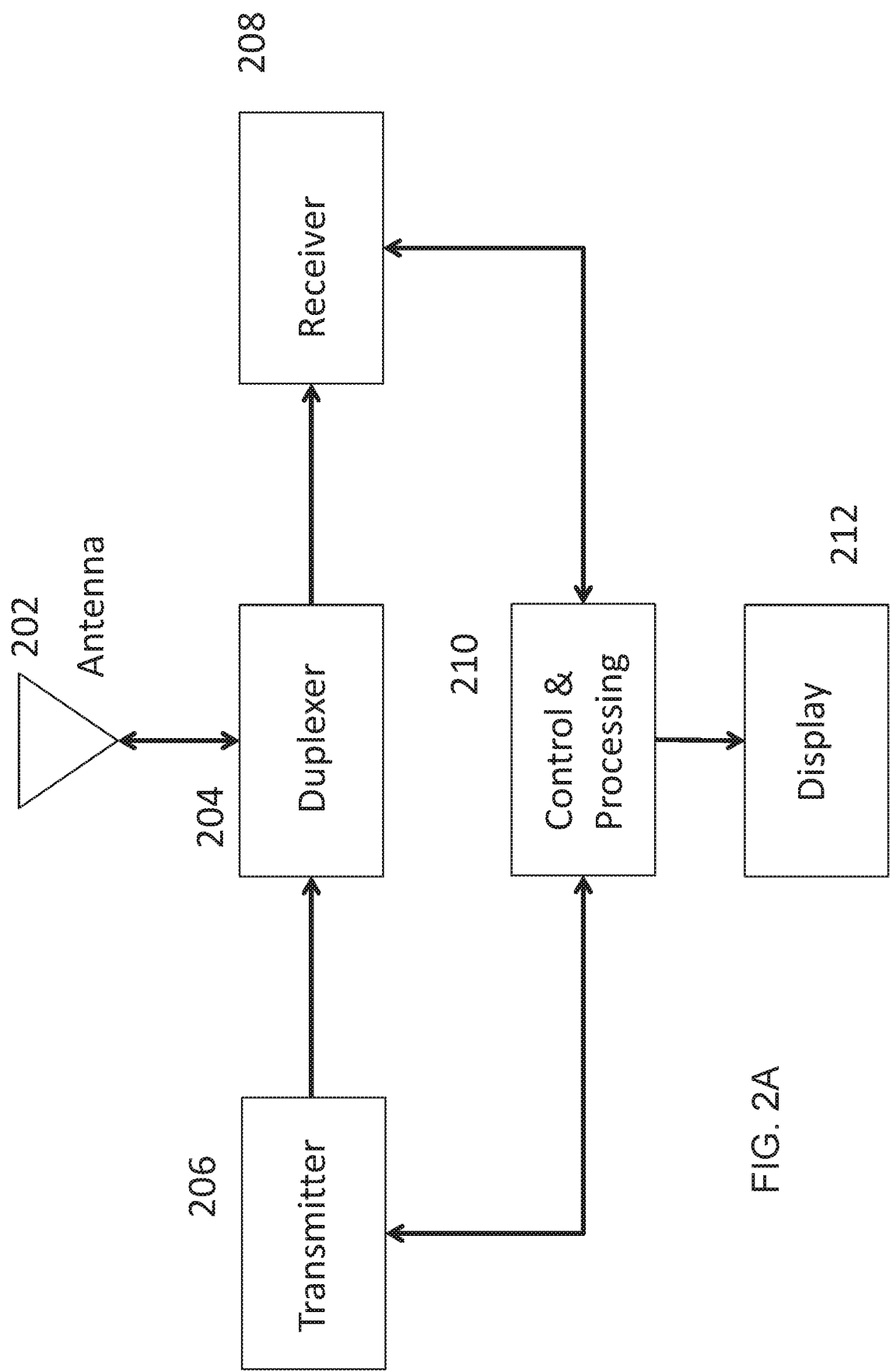
FIG. 2A and FIG. 2B are block diagrams of radar systems in accordance with the present invention.
Figure 2B:
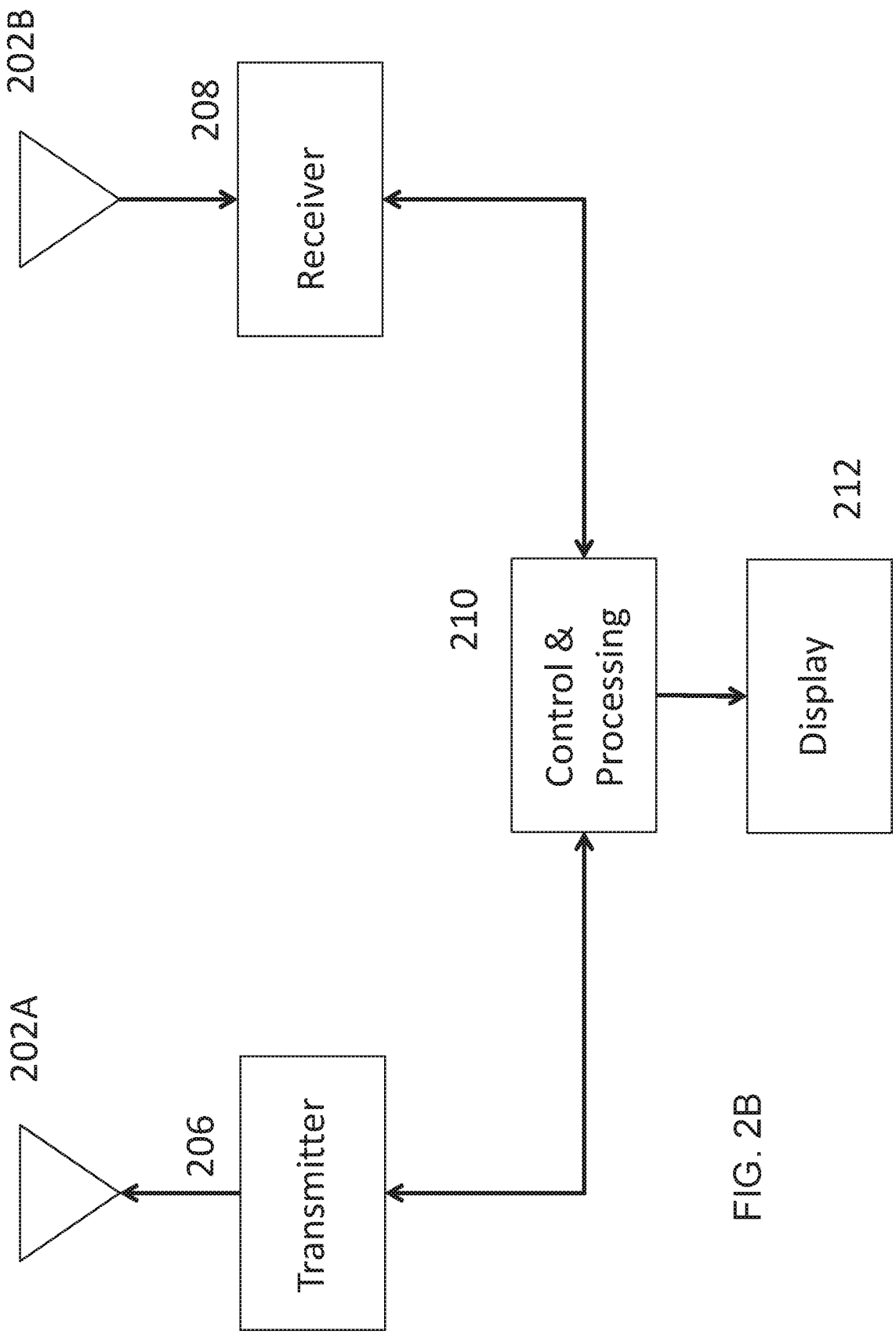

A further mode is a "debug and loopback mode." In this mode a control processor 210, illustrated in FIGS. 2A and 2B, may write specific data into the buffer 520. The control processor 210 may then trigger the data forward for processing to mimic an actual radar scan. The control processor 210 may also configure the buffer 520 and specify how many chips are to be stored. For the loopback mode, the control processor 210 may store a small subset of data and provide a start pointer, a stored length of data, and a total number of chips to be sent. The buffer 520 may then repeat the same pattern until a specified number of output chips have been made available to the correlation processor 532. Two loopback modes are possible. A first exemplary loopback mode allows the data to be reprocessed by the pre-buffer processing 510, as illustrated by a connection 515 in FIG. 5. This allows, for example, additional interference mitigation. Alternatively, the loopback may not include further pre-processing 510.

Another possibility (an exemplary second loopback mode) is that the buffer 520 may be written by the control processor 210, which allows the control processor 210 to write very specific data samples into the buffer 520 and play it back, and have the samples processed by the post-buffer processor 530. This allows the use of synthetic input data for verification purposes, but it can also be used as a HW accelerator for RDC processing.

Another mode is known as "quiet mode 1." In this mode the buffer 520 may store all incoming data (both RX and TX data) without forwarding anything to the correlation processing unit 532 while the data is being received. This may ensure that the digital noise from the correlators 532 and the rest of the digital post-buffer processor 530 will be minimal. In other words, the post-buffer processor 530 is in a sleep mode while the RF front end pre-buffer processor 510 is storing data in the buffer 520. As soon as the received signal has been completely received for a certain time interval, the stored data may be forwarded to the post-buffer processor 530 for further processing, such as performed by the correlation processor 532. The maximum number of chips stored preferably could be up to 22,000 chips.

An alternative to quiet mode 1 is "quiet mode 2." Quiet mode 2 is similar to quiet model. In quiet mode 2, the data is forwarded to the buffer 520 right from the ADC 480. In other words, even the pre-buffer processor 510 is not operating when the data is stored (in the buffer 520).

A further mode is the "raw data capture mode." In some situations, it may be desirable to have more data available for just one receiver of the receiver pipeline. Because a buffer 520 of a particular receiver is shared between receivers, if only one receiver is active, the buffer 520 of that receiver may optionally store more samples from that receiver by using memory for the receiver's samples that is normally allocated to the other receivers. The buffer 520 may also be used to capture raw data for calibration or further analysis since the buffer 520 can store data samples from all the receivers simultaneously at a rate that is faster than at which the samples are generated. In addition, the storing of samples may be stopped or triggered based on certain events, e.g. an external pin, or saturation, or other internal events, and may therefore be used as a digital oscilloscope for debugging.

Another mode is the "functional safety mode." Periodically, a predefined pattern may optionally be used and passed to the post-buffer processor 530. A cyclic redundancy check (CRC), an error detecting code, is calculated based on the result of the post-buffer processing (530). That is, the data at the output of the post-buffer processor 530 is used to generate CRC parity checks. These parity checks are stored in memory (the buffer 520). The number of parity checks stored is much smaller than the number of data bits at the output of the post-buffer processor 530, so storing these parity checks does not require a significant amount of memory. Subsequently, the same data may be passed to the post-buffer processor 530 and another CRC may then be computed. The new CRC is compared to the previously computed CRC. If the two CRCs do not match, an indication of hardware fault is generated. This mode may be used to provide periodic checks to see if the hardware is processing data properly or if there is a hardware error.

Changes and modifications in the specifically described embodiments can be carried out without departing from the principles of the present invention, which is intended to be limited only by the scope of the appended claims, as interpreted according to the principles of patent law including the doctrine of equivalents.

The invention claimed is:

1. A radar sensing system for a vehicle, the radar sensing system comprising:
 a transmitter configured for installation and use on a vehicle and configured to transmit radio signals;
 a receiver configured for installation and use on the vehicle and configured to receive radio signals that include the transmitted radio signals transmitted by the transmitter and reflected from objects in an environment;
 a controller configured to control the transmitter and the receiver; and
 wherein the receiver comprises:
  a buffer configured to receive and store data samples and further configured to operate in a plurality of modes on a same set of data samples stored in the buffer as defined by the controller; and
  a post-buffer processor configured to receive data samples output from the buffer, wherein the post-buffer processor is configured to perform processing operations on the received data samples, as defined by the controller.

2. The radar sensing system of claim 1 further comprising a pre-buffer processor configured to perform further processing operations on data samples of the received radio signals, and further configured to output the data samples to the buffer.

3. The radar sensing system of claim 2, wherein the pre-buffer processor is configured to remove interference caused by other radar sensing systems from the received radio signals.

4. The radar sensing system of claim 2, wherein the receiver further comprises an analog-to-digital converter (ADC) configured to sample the received radio signals and output data samples, and wherein the pre-buffer processor is configured to change a sample rate of the ADC.

5. The radar sensing system of claim 2, wherein the pre-buffer processor is configured to pass the data samples to the buffer without processing the data samples.

6. The radar sensing system of claim 1, wherein the post-buffer processor is configured to perform at least one of correlation processing to determine ranges of objects and Doppler processing to determine a velocity of the objects.

7. The radar sensing system of claim 6, wherein the plurality of modes of operation of the buffer comprise throttle, loopback, replay, and bypass.

8. The radar sensing system of claim 6, wherein the post-buffer processor is configured to perform a plurality of different correlation processing operations on a same set of data samples stored in the buffer.

9. The radar sensing system of claim 8, wherein a first correlation processing operation of the plurality of different correlation processing operations is configured to perform correlation processing over a first selected range of range bins, and wherein a second correlation processing operation of the plurality of different correlation processing operations is configured to perform correlation processing over a second selected range of range bins.

10. The radar sensing system of claim 6, wherein the post-buffer processor is configured to perform a plurality of different Doppler processing operations on a same set of data samples stored in the buffer.

11. The radar sensing system of claim 10, wherein the plurality of different Doppler processing operations comprises first and second Doppler processing operations, wherein the first Doppler processing operation is configured to produce Doppler frequencies that are different from Doppler frequencies produced by the second Doppler processing operation.

12. The radar sensing system of claim 1 further comprising a plurality of other receivers, and wherein, in combination with the plurality of other receivers, the post-buffer processor is configured to determine angular locations of the objects.

13. The radar sensing system of claim 12, wherein the buffer is further configured to also receive and store data samples from each of the plurality of other receivers.

14. The radar sensing system of claim 1, wherein the buffer comprises a pair of memories, and wherein the buffer is configured to simultaneously perform a write operation on one of the pair of memories and a read operation on the other of the pair of memories.

15. A radar sensing system for a vehicle, the radar sensing system comprising:
    a plurality of transmitters configured for installation and use on a vehicle and configured to transmit radio signals;
    a plurality of receivers configured for installation and use on the vehicle and configured to receive radio signals that include the transmitted radio signals transmitted by the transmitters and reflected from objects in an environment;
    a controller configured to control the transmitters and the receivers; and
    wherein a first receiver of the plurality of receivers comprises:
        a buffer configured to receive and store data samples and further configured to operate in a plurality of modes on a same set of data samples stored in the buffer as defined by the controller; and
        a post-buffer processor configured to receive data samples output from the buffer, wherein the post-buffer processor is configured to perform at least one of correlation processing to determine object ranges, Doppler processing to determine object velocity, and, in combination with other receivers of the plurality of receivers, further processing to determine angular locations of the objects.

\* \* \* \* \*